United States Patent
Tanaka

Patent Number: 5,898,327
Date of Patent: Apr. 27, 1999

[54] LOW-POWER RESET SIGNAL GENERATING CIRCUIT IMPROVED IN VOLTAGE RISING CHARACTERISTIC

[75] Inventor: Toshimasa Tanaka, Kyoto, Japan

[73] Assignee: Rohm Co. Ltd., Kyoto, Japan

[21] Appl. No.: 08/872,387

[22] Filed: Jun. 10, 1997

[30] Foreign Application Priority Data

Jun. 11, 1996 [JP] Japan ................. 8-149001

[51] Int. Cl.$^6$ ................................................. H03L 7/00
[52] U.S. Cl. .......................................... 327/143; 327/198
[58] Field of Search ............................ 327/142, 143, 327/198

[56] References Cited

U.S. PATENT DOCUMENTS

| | | | |
|---|---|---|---|
| 4,405,871 | 9/1983 | Buurma et al. | 327/143 |
| 4,939,385 | 7/1990 | Dubujet | 327/143 |
| 5,528,182 | 6/1996 | Yokosawa | 327/143 |

*Primary Examiner*—Timothy P. Callahan
*Assistant Examiner*—Jeffrey Zweizig
*Attorney, Agent, or Firm*—Nikaido Marmelstein Murray & Oram, LLP

[57] ABSTRACT

A reset signal generating circuit is provided between a power supply voltage terminal for supplying an electric voltage and ground for being maintained at a given potential. A CR time constant circuit has a first transistor and a first capacitor connected in series. A control circuit sets the start of operation for the first transistor. A discharge circuit discharges the electric charge stored on the first capacitor when electric power supply is turned off. A protection circuit against a negative over-voltage applied to the first transistor by the discharge circuit. To this end, a reset signal generating circuit provides a reset signal when restarting a power supply and positively outputting a reset signal even where the power supply has an abrupt rising characteristic, without consuming electric current in a steady state.

8 Claims, 3 Drawing Sheets

LOW-POWER RESET SIGNAL GENERATING CIRCUIT IMPROVED IN VOLTAGE RISING CHARACTERISTIC

BACKGROUND OF THE INVENTION

This invention relates to a reset signal generating circuit for generating a reset signal during turning on a power supply. More particularly, the invention is concerned with a reset signal generating circuit which is adapted to reduce consumption of electric power by a reset circuit during operating a system circuit, and generate a reset signal without fail regardless of a rising characteristic in power supply voltage during resetting the system circuit.

Conventionally, there have been reset signal generating circuits for resetting a system circuit during turning on a power supply, as shown in FIG. 4(a) and FIG. 4(b).

The circuit of FIG. 4(a) is a reset signal generating circuit that uses a CR time constant circuit adapted to supply to an output terminal $R_{OUT}$ a low level signal lower than a power supply voltage $V_{cc}$ for a time period determined by the on-resistance R of a transistor Q5 and the capacitance of a capacitor C5. That is, the transistor Q5 formed for example by a PMOSFET and the capacitor C5 are connected in series between a terminal of power supply $V_{cc}$ and a ground GND. While the capacitor C5 is being charged after turning on the transistor Q5, a low level signal lower in voltage than a power supply voltage $V_{cc}$ is outputted through the output terminal $R_{OUT}$. Here, the transistor Q5 has a gate connected to the ground GND.

This circuit utilizes the on-resistance of the active-element transistor Q5 as a resistance instead of a passive-element resistance. Consequently, the transistor Q5 will not be turned on until the gate-to-source voltage of the transistor Q5 is raised to a threshold voltage. Here, the threshold voltage means a minimum voltage for turning on a transistor that is applied between the gate and the source of the transistor. As a result, the charging electricity to the capacitor C5 is not started until the threshold voltage of the transistor is reached, even where the slant of rising in the power supply voltage $V_{cc}$ is smaller than the slant of electricity charging given by the CR time constant, ensuring time period for voltage lower than the power supply voltage $V_{cc}$.

The circuit shown in FIG. 4(b) includes voltage-divisional resistances R5, R6 connected in series between a power supply voltage $V_{cc}$ terminal and a ground GND, and a comparator COM connected to a connection point between these resistances. The divisional voltage $V_{R6}$ taken out of the connection point is compared with a constant voltage $V_C$ by the comparator COM. The comparator COM outputs a low level signal as a reset signal to an output terminal $R_{OUT}$ before the power supply voltage $V_{cc}$ becomes to such a level that the divisional voltage $V_{R6}$ is higher than the constant voltage $V_C$.

In the circuit of FIG. 4(a), however, the gate of the transistor Q5 is fixedly connected to the ground GND. Consequently, even after the power supply voltage $V_{cc}$ is turned off and becomes a zero voltage, there remains a potential corresponding to the threshold voltage $V_{th}$ of the transistor Q5. To this end, the capacitor C5 is not completely discharged and the potential on the output terminal $R_{OUT}$ is not to be reduced down to a zero voltage. As a result, where performing resetting by once turning off the power supply, there are cases that no reset signal be available on the output terminal $R_{OUT}$.

Meanwhile, in the circuit of FIG. 4(b), if the power supply voltage $V_{cc}$ is abrupt in rising, there encounters a case that the time period for generating a reset signal to the output terminal $R_{OUT}$ is too brief to stably performing a reset operation. Further, this circuit has an electric current steadily flowing through the resistances R5, R6 connected between the power supply voltage $V_{cc}$ terminal and the ground GND. There is a problem that it is inconvenient for use in an integrated circuit for portable electric appliances and devices because of relatively high electric power consumption.

SUMMARY OF THE INVENTION

It is therefore the object of the present invention to provide a reset signal generating circuit, which is capable of providing a reset signal upon restarting a power supply and positively offering a reset signal even where the power supply has an abrupt rising characteristic, without consuming electric current in a steady state.

In accordance with the present invention, there is provided a reset signal generating circuit connected between a power supply voltage terminal a ground terminal, comprising:

a CR time constant circuit having a first transistor and a first capacitor connected in series;

a control circuit for setting the start of operation of the first transistor; and a discharge circuit for discharging the electric charge stored on the first capacitor when electric power supply is turned off.

With such a structure, the start of operation of the first transistor is freely determined to thereby secure a time period for generating a reset signal even where the power supply voltage abruptly rises. Furthermore, when the power supply is turned off, the electric charge built up on the first transistor is immediately discharged through the discharge circuit. Consequently, a reset signal is positively outputted even when restarting a power supply.

Preferably, the reset signal generating circuit includes a protection circuit for preventing against a negative over-voltage applied to the first transistor by the discharge circuit.

More preferably, the control circuit comprises a second transistor and at least one semiconductor element generating a predetermined voltage which are connected in series between the power supply voltage terminal and the ground terminal, wherein start of operation of the first transistor is determined by a voltage applied to a connecting point between the second transistor and the semiconductor device. By doing so, the starting of operation of the first transistor is controlled by a voltage applied to a connecting point between the second transistor and the semiconductor circuit element. That is, the operation of the first transistor can be retarded to a time point that the power supply voltage is increased twice a threshold voltage of the transistor, thereby positively outputting a reset signal even where the power supply voltage rises moderately.

Here, the semiconductor circuit element in diode connection means an electronic element such as a MOSFET in diode connection, a diode, a bipolar transistor in diode connection, and so on.

Further preferably, the second transistor comprises a MOSFET, and the second transistor having a gate connected to a connection point between the first transistor and the first capacitor. By doing so, when the power supply voltage reaches a steady state, the voltage between the gate and the source of the second transistor becomes a threshold voltage, bringing the second transistor to an off state and hence eliminating current consumption during a steady state.

Still further preferably, the discharge circuit further comprises a second capacitor connected between the first transistor and the power supply voltage terminal, wherein the first transistor comprises a MOSFET to have a gate connected to the second capacitor. With such a simple structure, when the power supply voltage falls down to zero, the gate of the MOSFET has a negative voltage to pass in reverse an electric current therethrough, allowing the electric charge to be discharged out of the first capacitor.

Preferably, a diode-connected semiconductor element in reverse or a MOSFET having a gate short-circuited to a source thereof is connected between the gate of the first transistor and the ground terminal to form a protection circuit thereby forming a protection circuit. By doing so, even if a negative high voltage is applied to the gate of the first transistor, it is to be released through the diode, thus protecting the first transistor against such an over-voltage.

For a fuller understanding of the nature and advantages of the invention, reference should be made to the ensuing detailed description taken in conjunction with the accompanying drawings.

DETAILED DESCRIPTION OF THE INVENTION

Figure 1:
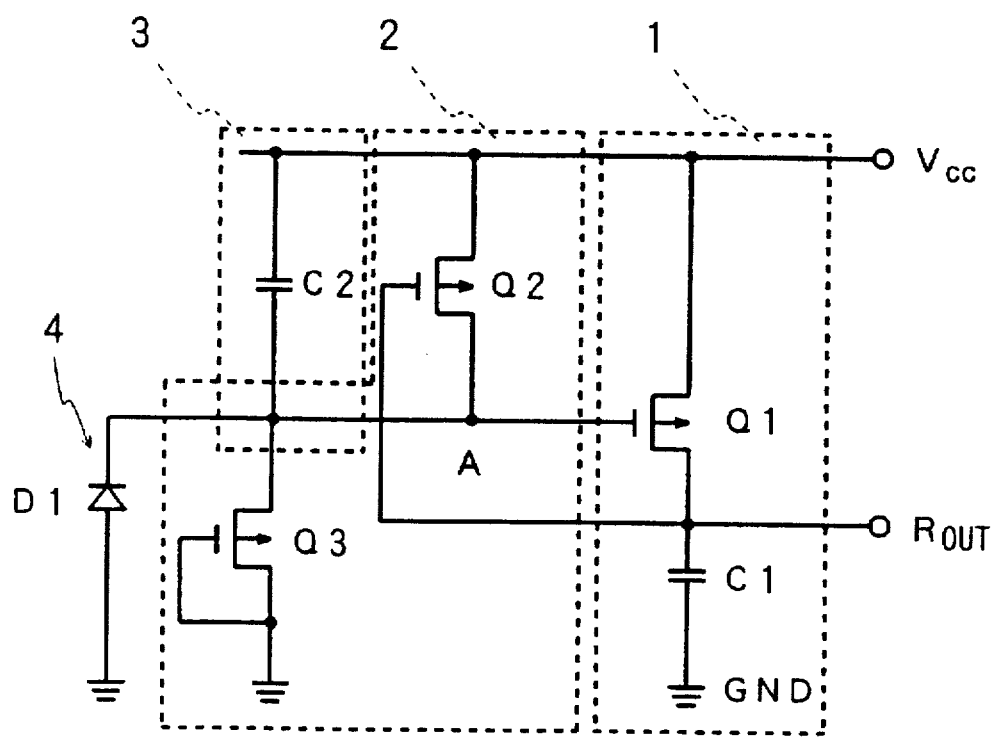
FIG. 1 is a circuit diagram of a reset signal generating circuit according to one embodiment of the present invention.

Referring first to FIG. 1, there is illustrated a reset signal generating circuit according to one embodiment of the present invention. The reset signal generating circuit comprising a CR time constant circuit 1 having a first transistor Q1 and a first capacitor C1 connected in series, a control circuit 2 for setting start of operation of the first transistor Q1, and a discharge circuit 3 for discharging electric charge stored on the first capacitor C1.

The CR time constant circuit 1 is configured by a first transistor Q1 formed for example by a PMOSFET and a first capacitor C1. These first transistor Q1 and first capacitor C1 are connected in series between a terminal of a power supply voltage $V_{cc}$ and a ground GND, thus utilizing on-resistance, i.e. a series resistance in an on state, of the first transistor Q1. The first transistor Q1 and the first capacitor has therebetween a connecting point to which connected is an output terminal $R_{OUT}$ for providing an output as a reset signal.

The control circuit 2 is for setting a given voltage at which the transistor Q1 starts operating. The control circuit 2 has second and third transistors Q2, Q3 connected in series between the power supply terminal $V_{cc}$ and the ground GND, which transistors are formed by a PMOSFET alike the first transistor Q1. The second and third transistors Q2, Q3 has therebetween a connecting point that is connected to a gate of the first transistor Q1 of the CR time constant circuit 1 so that a threshold voltage at which the third transistor turns on is applied to the gate of the first transistor Q1. When the power supply voltage $V_{cc}$ exceeds the sum of the third transistor Q3 threshold voltage and the first transistor Q1 threshold voltage, the first transistor Q1 is turned on. The second transistor Q2 has a gate that is connected to the connecting point between the first transistor Q1 and the first capacitor C1, i.e., to the output terminal $R_{OUT}$.

The third transistor Q3 has a gate short-circuited to a drain thereof to generate a predetermined voltage. Consequently the third transistor Q3 is not necessarily of a MOSFET, but may be another or ordinary type of a diode or a bipolar transistor having diode connection. It is however preferred to form the third transistor Q3 by a MOSFET through the utilization of common processes to other MOS-structured circuit elements. This semicondctor element Q3 serves to apply its forward rising voltage, i.e. a threshold voltage, to the gate of the first transistor Q1 to thereby establish an operation-start time point of the first transistor Q1. Accordingly, by increasing the number of this semicondctor circuit element Q3 in diode connection, the turning-on voltage for the first transistor Q1 can be raised high to thereby broaden a range of voltage for outputting a reset signal.

The discharge circuit 3 is for discharging the electric charge stored on the first capacitor C1 of the CR time constant circuit 1 when the power supply is turned off. The discharge circuit 3 is formed by a second capacitor C2 connected between the power supply terminal $V_{cc}$ and the gate of the first transistor Q1. That is, the discharge circuit 3 operates by the utilization of a charge conservation principle for the second capacitor C2, wherein, when the power supply voltage $V_{cc}$ becomes 0, the potential at a point A in FIG. 1 is brought to a negative side in a manner conserving the electric charge stored by the second capacitor C2. At this time, the first transistor Q1 is turned on in reverse to thereby discharge the electric charge stored on the first capacitor C1 through the first transistor Q1.

In the discharge of the electric charge out of the first capacitor C1, if the negative voltage applied to the gate of the first transistor Q1 is excessively high, there arises a fear of damaging the transistor Q1. In order to suppress against an excessively-high negative voltage application to the gate of the first transistor Q1, the diode D1 is connected in reverse between the gate of the first transistor Q1 and the ground GND so as to protect the first transistor Q1, thus forming a protection circuit 4 for the first transistor Q1. To this end, when the potential at the point A becomes lower than the threshold voltage of the diode D1, electric discharge is made through the diode D1 so that the potential at the point A is brought to and maintained at the negative threshold voltage of the diode D1. Assuming that the power supply voltage in a steady state is $V_{cc}$ and the threshold voltage of the third transistor Q3 is $V_{th}$, the second capacitor C2 has a voltage of $V_{cc}-V_{th}$. At the moment that the power supply voltage $V_{cc}$ goes to 0, the voltage at the point A will have a great negative voltage of $V_{th}-V_{cc}$. However, the voltage at the point A is maintained at almost $-V_{thd}$ (threshold voltage of the diode D1) by the diode D1 of the protection circuit 4.

Instead of the diode D1, the protection circuit 4 may be formed by other diode-connected semiconductor elements such as a bipolar transisitor, or by MOSFET having a gate short-circuited to a source thereof. By connecting a plurality of diodes, instead of sole one diode, in series, it is possible to control the gate voltage of the transistor Q1.

Although in the above embodiment the first and second transistors were formed by a PMOSFET, they may be an NMOSFET.

Figure 2:
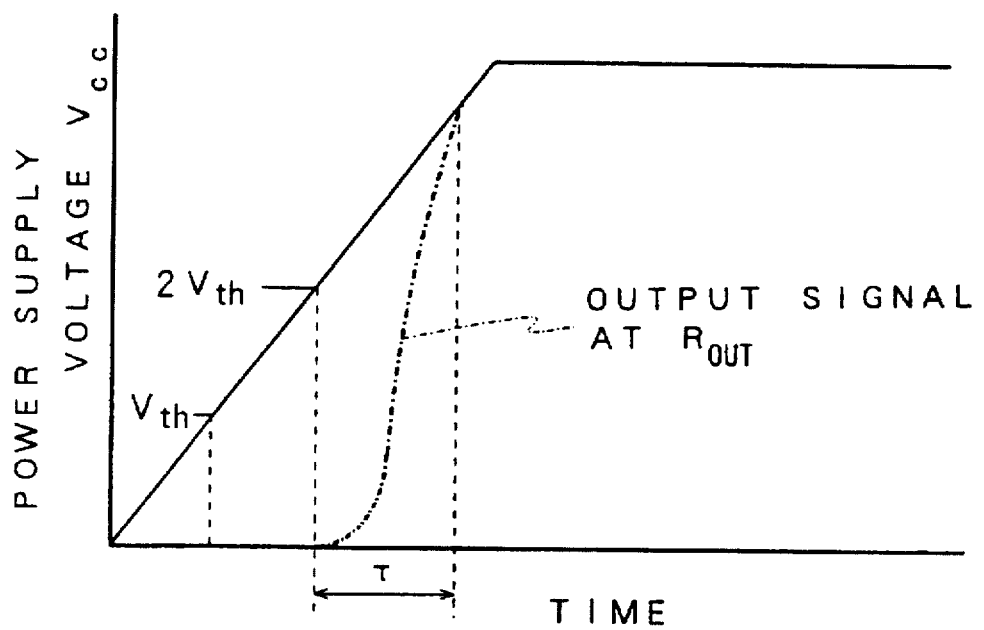
FIG. 2 is a graph for explaining the relation between rising in power supply voltage and generation of a reset signal in the reset signal generating circuit of FIG. 1.

The reset-signal generating circuit thus configured will then be explained by referring to FIG. 2 wherein shown is the relation between the rising in power supply voltage $V_{cc}$ and the output signal at the output terminal $R_{OUT}$.

While the power is off, the output voltage at $R_{OUT}$ is in a low level L. When the power is turned on to thereby raise the power supply voltage $V_{cc}$ to a threshold voltage $V_{th}$ of the second transistor Q2, the second transistor Q2 is turned on so that the point A in FIG. 1 has a potential of $V_{cc}-V_{th}$. Here, it is assumed that every transistor in the figure has the same threshold voltage $V_{th}$. Further, if the power supply voltage $V_{cc}$ is increased to such a value that the potential at the point A brings the third transistor Q3 to its threshold value $V_{th}$, the third transistor Q3 is turned on. As a result, even if the power supply voltage $V_{cc}$ further increases, the potential at the point A is held at $V_{th}$ by the third transistor Q3. If the power supply voltages $V_{cc}$ further increases higher by an amount of a threshold voltage $V_{th}$ of the first transistor Q1 than the potential at the point A, that is, twice the threshold voltage $V_{th}$, the first transistor Q1 is turned on to start charging the first capacitor C1.

If the present reset signal generating circuit is fabricated in a one-chip semiconductor substrate, the PMOSFETs of the first to third transistor Q1 to Q3 is easily provided with a common threshold voltage $V_{th}$ value. When the first capacitor C1 begins charging, the reset signal circuit is in an operational state with the output signal of a low level "L" at the output terminal $R_{OUT}$. This output signal can be utilized as a reset signal. If the power supply voltage $V_{cc}$ further increases, the potential of the output terminal $R_{OUT}$ becomes a high level "H" after lapse of time period ($\tau=1/(R \cdot C)$) that is determined by the on-resistance R of the first transistor Q1 and the capacitance C of the first capacitor C1. Consequently, the second transistor Q2 is turned off as soon as the gate-to-source voltage thereof reaches the threshold voltage $V_{th}$. At this time, the potential at the point A is held stabilized at $V_{th}$, and the reset state is canceled. In this process, the second capacitor C2 has a charge voltage of $V_{cc}-V_{th}$.

In a steady state that the reset has been canceled, the first transistor Q1 is on but has almost no passing current due to the first capacitor C1. On the other hand, the second transistor Q2 and the third transistor Q3 are both off, and no current flows through the control circuit 2. Therefore, there occur no unwanted consuming currents through the reset-signal generating circuit.

When the power supply voltage is turned off, the potential at the point A lowers toward a potential $V_{th}-V_{cc}$ by the second capacitor C2. In this case, both the second transistor Q2 and the third transistor Q3 are also in an off state. However, due to the connection of the diode D1 in the protection circuit 4, when the potential at the point A becomes lower than a negative value of the threshold voltage $V_{thd}$ of the diode D1, the diode D1 is turned on. This causes the potential at the point A to be clamped at $-V_{thd}$. That is, the diode D1 serves to prevent the first transistor Q1 from being applied by an excessive voltage. To this end, the first transistor Q1 has a gate voltage of $-V_{th}$ so that it is turned on in reverse to thereby discharge the electric charge on the first capacitor C1 through the first transistor Q1, lowering the output potential at the output terminal $R_{OUT}$ down to almost the ground potential. In this manner, where the reset-signal generating circuit is once turned off and thereafter restarted, the output terminal $R_{OUT}$ gives a low level of an output, ensuring resetting operation.

Figure 3:
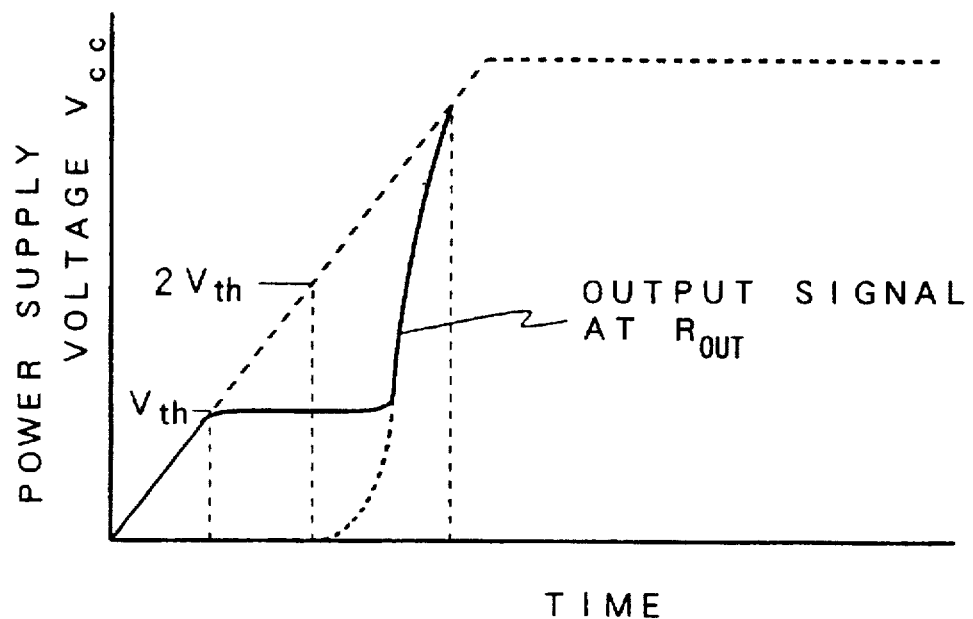
FIGS. 3(a) to 3(b) are graphs for explaining generation of a reset signal upon restarting in the reset signal generating circuit of FIG. 1.
Figure 3:
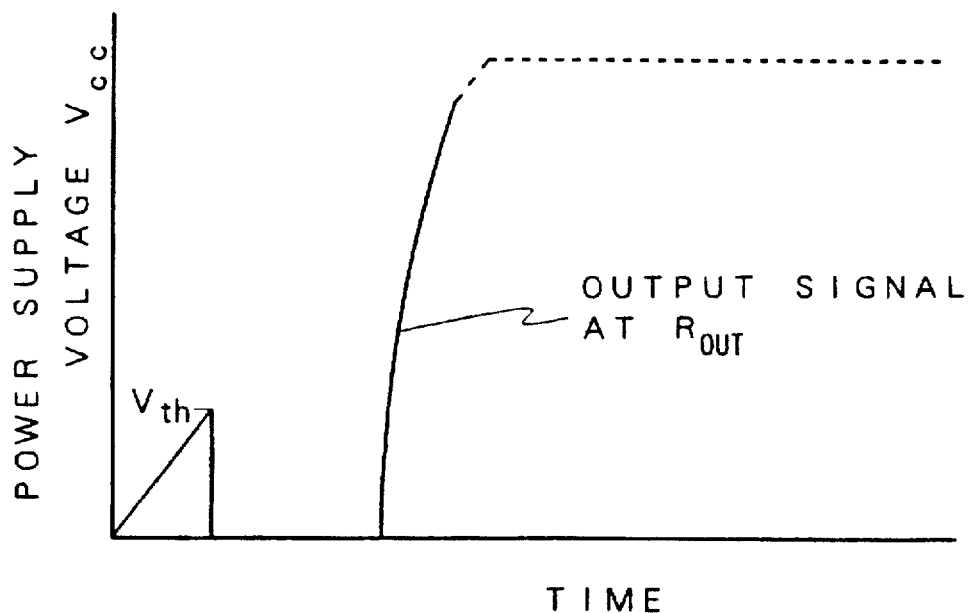
Figure 4:
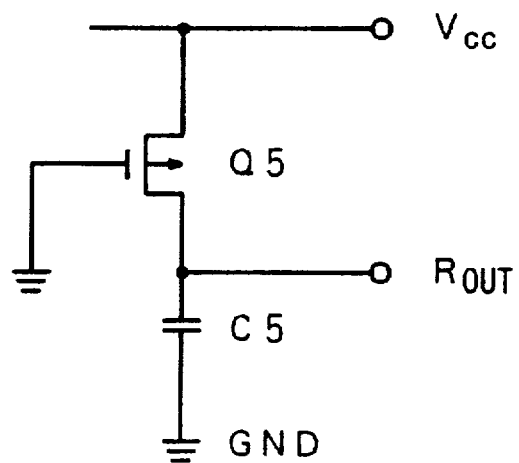
FIGS. 4(a) to 4(b) are conventional reset signal generating circuits.
Figure 4:
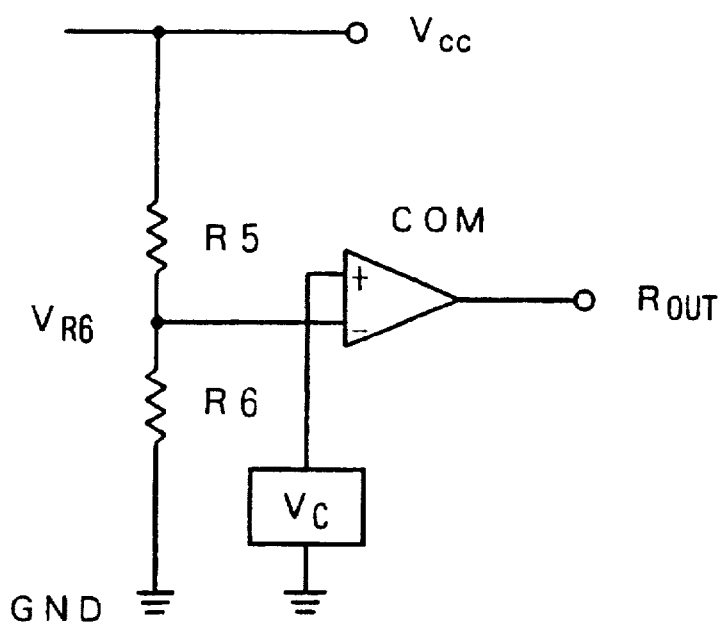

FIG. 3(a) shows an output signal at the output terminal $R_{OUT}$ during restarting. When the reset-signal generating circuit is restarted, the point A is at a potential of $-V_{thd}$. The first transistor Q1 stays on until the second transistor Q2 is turned on. Accordingly, as shown in FIG. 3(a), the output signal voltage at the output terminal $R_{OUT}$ increases with increase in the power supply voltage $V_{cc}$ until the power supply voltage $V_{cc}$ reaches a threshold voltage $V_{th}$. If the power supply voltage $V_{cc}$ reaches the threshold voltage $V_{th}$, the transistor Q2 is turned on to bring the potential at the point A up to $V_{th}$. Consequently, the transistor Q1 is turned off and the output terminal $R_{OUT}$ is maintained at the potential $V_{th}$. Thereafter, when the power supply voltage $V_{cc}$ increases higher than $2V_{th}$ to turn on the transistor Q1, the potential at the output terminal $R_{OUT}$ increases in a manner shown by the curve line in FIG. 3(a). However, if a buffer is provided on the output terminal $R_{OUT}$ side so as to modify the characteristic curve, an output signal as shown in FIG. 3(b) is available that is appropriate for resetting operation.

According to the present invention, the rising time of a reset signal is determined by a time constant of a CR time constant circuit, wherein a control circuit for operating the CR time constant circuit has a voltage value determined by a threshold voltage of a diode-connected semiconductor circuit element thereof. Therefore, it is possible to generate a reset signal without being influenced by a rising characteristic of a power supply voltage, that is, regardless of abrupt or moderate in rise of the power supply voltage.

While the power supply voltage is in steady, the control circuit is in an off state so that unwanted power consumption is avoided. Therefore, the reset signal generating circuit is conveniently utilized particularly for portable apparatuses and devices that require low consumption of power.

Furthermore, the provision of the discharge circuit makes possible immediate discharging the electric charge built up on the first capacitor of the CR time constant circuit, when the power supply is turned off. This ensures positive outputting of a reset signal upon performing restarting.

Although preferred embodiments have been described in some detail, it is to be understood that certain changes can be made by those skilled in the art without departing from the spirit and scope of the invention as defined by the appended claims.

What is claimed is:

1. A reset signal generating circuit provided between a power supply voltage terminal, comprising:
   a CR time constant circuit having a first transistor and a first capacitor connected in series;
   a control circuit for setting the start operation of said first transistor;
   a discharge circuit for discharging the electric charge stored on said first capacitor when electric power supply is turned off; and
   a protection circuit for preventing against a negative over-voltage applied to said first transistor by discharge circuit.

2. The reset signal generating circuit of claim 1, said control circuit comprising a second transistor and at least one semiconductor element generating a predetermined voltage which are connected in series between said power supply voltage terminal and said ground terminal, wherein start of operation of said first transistor is determined by a voltage applied to a connecting point between said second transistor and said semiconductor device.

3. The reset signal generating circuit of claim 2, wherein said second transistor comprises a MOSFET, and said second transistor having a gate connected to a connection point between said first transistor and said first capacitor.

4. The reset signal generating circuit of claim 2, said discharge circuit comprising a second capacitor connected between said first transistor and said power supply voltage terminal, wherein said first transistor comprises a MOSFET to have a gate connected to said second capacitor.

5. The reset signal generating circuit of claim 4, wherein a diode-connected semiconductor element is connected in reverse between said gate of said first transistor and said ground terminal to form said protection circuit.

6. The reset signal generating circuit of claim 4, wherein a MOSFET having a gate short-circuited to a source thereof is connected between said gate of said first transistor and said ground terminal to form said protection circuit.

7. A reset signal generating circuit provided between a power supply voltage terminal and a ground terminal, comprising:

- a CR time constant circuit having a first transistor capacitor connected in series;
- a control circuit for setting the start of operation of said first transistor; and
- a discharge circuit for discharging the electric charge stored on said first capacitor when electric power supply is turned off;
- said control circuit comprising a second transistor and at least one semiconductor element generating a predetermined voltage which are connected in series between said power supply voltage terminal and said ground terminal, wherein start of operation of said first transistor is determined by a voltage applied to a connecting point between said second transistor and said semiconductor device;
- said discharge circuit comprising a second capacitor connected between said first transistor and said power supply voltage terminal, wherein said first transistor comprises a MOSFET to have a gate connected to said second capacitor; and
- wherein a diode-connected semiconductor element is connected in reverse between said gate of said first transistor and said ground terminal to form a protection circuit.

8. A reset signal generating circuit provided between a power supply voltage terminal and a ground terminal, comprising:

- a CR time constant circuit having a first transistor and a first capacitor connected in series;
- a control circuit for setting the start of operation of said first transistor; and
- a discharge circuit for discharging the electric charge stored on said first capacitor when electric power supply is turned off;
- said control circuit comprising a second transistor and at least one semiconductor element generating a predetermined voltage which are connected in series between said power supply voltage terminal and said ground terminal, wherein start of operation of said first transistor is determined by a voltage applied to a connecting point between said second transistor and said semiconductor device;
- said discharge circuit comprising a second capacitor connected between said first transistor and said power supply voltage terminal, wherein said first transistor comprises a MOSFET to have a gate connected to said second capacitor; and
- wherein a MOSFET having a gate short-circuited to a source thereof is connected between said gate of said first transistor and said ground terminal to form a protection circuit.

* * * * *